(12) United States Patent
Cho et al.

(10) Patent No.: US 8,842,025 B2
(45) Date of Patent: Sep. 23, 2014

(54) METHOD OF SETTING SPECIFIC SCAN CODES FOR MANUAL INPUT DEVICE

(75) Inventors: Yeh Cho, Taipei (TW); Chewei Kuo, Taipei (TW); Yuping Perng, Hsin-Tien (TW)

(73) Assignee: Via Technologies, Inc., Taipei (TW)

( * ) Notice: Subject to any disclaimer, the term of this patent is extended or adjusted under 35 U.S.C. 154(b) by 1902 days.

(21) Appl. No.: 11/896,627

(22) Filed: Sep. 4, 2007

(65) Prior Publication Data

US 2008/0252493 A1    Oct. 16, 2008

(30) Foreign Application Priority Data

Apr. 16, 2007 (TW) .............................. 96113392 A

(51) Int. Cl.
*H03M 11/00* (2006.01)
*H03M 11/20* (2006.01)

(52) U.S. Cl.
CPC .................................... *H03M 11/20* (2013.01)
USPC ........................................... 341/26; 345/168

(58) Field of Classification Search
CPC ................................ G06F 3/023; H03M 11/20
USPC ............................ 341/20, 22, 26, 23; 345/168
See application file for complete search history.

(56) References Cited

U.S. PATENT DOCUMENTS

| 4,484,305 | A | * | 11/1984 | Ho | 715/210 |
| 4,964,075 | A | * | 10/1990 | Shaver et al. | 710/67 |
| 5,847,697 | A | * | 12/1998 | Sugimoto | 345/168 |
| 5,935,225 | A | * | 8/1999 | Peng et al. | 710/67 |
| 6,198,474 | B1 | * | 3/2001 | Roylance | 345/168 |
| 7,057,533 | B2 | * | 6/2006 | Wang | 341/22 |
| 2005/0179664 | A1 | * | 8/2005 | Lee | 345/168 |

FOREIGN PATENT DOCUMENTS

TW    200426662    12/2004

* cited by examiner

*Primary Examiner* — Albert Wong
(74) *Attorney, Agent, or Firm* — Birch, Stewart, Kolasch & Birch, LLP

(57) ABSTRACT

A method of setting specific scan codes for a manual input device includes the steps of establishing a transmission channel between the manual input device and a scan code register of a computing device, receiving at least one scan code, which corresponds to at least one input key of the manual input device and is for setting a customized specific code for enabling the computing device to perform a specific function, from the manual input device, saving the customized specific code to the scan code register of the computing device, and closing the transmission channel.

19 Claims, 5 Drawing Sheets

METHOD OF SETTING SPECIFIC SCAN CODES FOR MANUAL INPUT DEVICE

CROSS REFERENCE TO RELATED APPLICATIONS

This Non-provisional application claims priority under 35 U.S.C. §119(a) on Patent Application No(s). 096113392 filed in Taiwan, Republic of China on Apr. 16, 2007, the entire contents of which are hereby incorporated by reference.

BACKGROUND OF THE INVENTION

1. Field of Invention

The invention relates to a method of setting specific scan codes for a manual input device.

2. Related Art

A computer usually has a manual input device for the user to input commands or data. The frequently used manual input device is a keyboard or a mouse having a PS2 interface or a USB interface. The user may press keys on the keyboard or the mouse to input the data to the computer or to command the computer.

Usually, the computer includes a central processing unit (CPU), a south bridge chip and a north bridge chip, which serves as a bridge between a peripheral device and the CPU of the computer. Referring to FIG. 1, the south bridge chip 1 includes a scan code register 11, a manual input device input/output buffer 12 and a manual input device controller 13, and a keyboard 14 is used in conjunction with the south bridge chip 1. Wherein the manual input device input/output buffer 12 is used to buffer all input codes generates by keyboard 14, and the manual input device controller judges whether the input code from the manual input device input/output buffer is a scan code, and if the input code is the scan code, it will be transmitted to the scan code register. When the user wants to perform the special function, he or she may press a key or keys on the keyboard 14, and the keyboard 14 generates and outputs a corresponding scan code to the manual input device input/output buffer 12 in the south bridge chip 1. The manual input device input/output buffer 12 buffers the input/output data and transmits the buffered scan code to the scan code register 11.

In addition, the computer has a basic input/output system (BIOS) for saving one special scan code or a plurality of special scan codes corresponding to the special function or the special functions. These special scan codes are loaded into the scan code register 11. The manual input device controller 13 judges whether the scan code generated by the keyboard 14 is the same as the special scan code in the scan code register 11. If the scan code is the same as the special scan code, the computer performs the corresponding special function, such as a wake-up function.

However, the computer does not allow the user to change the initial settings or to set a complicated special function key, and the user may feel inconvenient in use. For example, when the computer enters a sleep state, a specific key is required to wake up the computer. In addition, the user may desire that other users cannot wake up the computer. In this case, the user may set a complicated key group as the wake-up key. Nevertheless, the typical computer cannot obtain the scan code corresponding to the complicated key, and also cannot provide the method of resetting the special function key. Thus, the user cannot set the complicated key as the wake-up key.

In addition, the system chip manufacturer has to know the settings of the assistant manufacturer in order to save the special scan code to the BIOS correctly. Because the system chip manufacturer or the user cannot know the scan code corresponding to each key, it gets more convenient if the assistant manufacturer can change the settings and save the special scan code in the scan code register directly, and the system chip manufacturer also will find out the correct special scan code more efficiently. Besides, according to the conventional technology, the user can only formally use the initial settings of the computer manufacturer and follows the initial settings of the computer, but cannot set the special function key according to his/her requirement.

Therefore, it is an important subject to provide a method of effectively setting specific scan codes for a manual input device.

SUMMARY OF THE INVENTION

In view of the foregoing, the invention is to provide a method of effectively setting specific scan codes for a manual input device.

To achieve the above, the invention discloses a method of setting specific scan codes for a manual input device. The method includes the following steps of establishing a transmission channel between the manual input device and a scan code register of a computing device, receiving at least one scan code, which is used to set a customized specific code for enabling the computing device to perform a specific function, from the manual input device, and saving the customized specific code to the scan code register and a manual input device input/output buffer of the computing device.

As mentioned above, the transmission channel is established between the scan code register and the manual input device so that the scan code generated by the manual input device can be directly saved to the scan code register without through the manual input device input/output buffer in the method of setting the specific scan code according to the invention. In addition, at least one scan code corresponding to a specific function may be received from the scan code register through the established transmission channel, and the user can set a group of specific function keys by himself or herself according to different setting methods. In addition, because the inputted scan code can be transmitted to the scan code register without through the manual input device input/output buffer, the operation efficiency of the computing device can be further enhanced.

BRIEF DESCRIPTION OF THE DRAWINGS

The invention will become more fully understood from the detailed description given herein below illustration only, and thus is not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
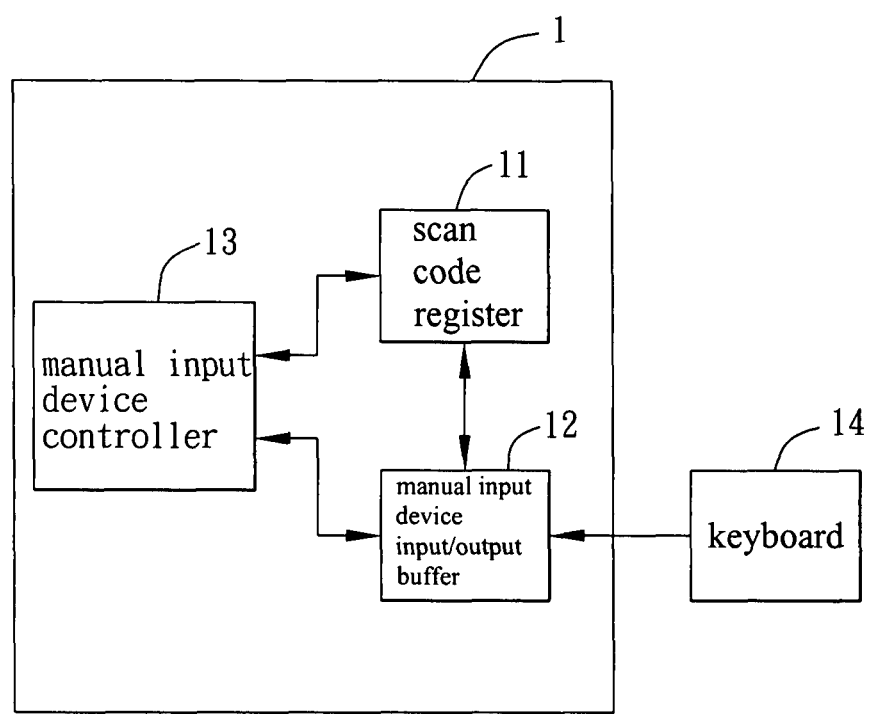
FIG. 1 is a schematic illustration showing a part of a computing device applying a conventional method of setting specific scan codes for a manual input device.
Figure 2:
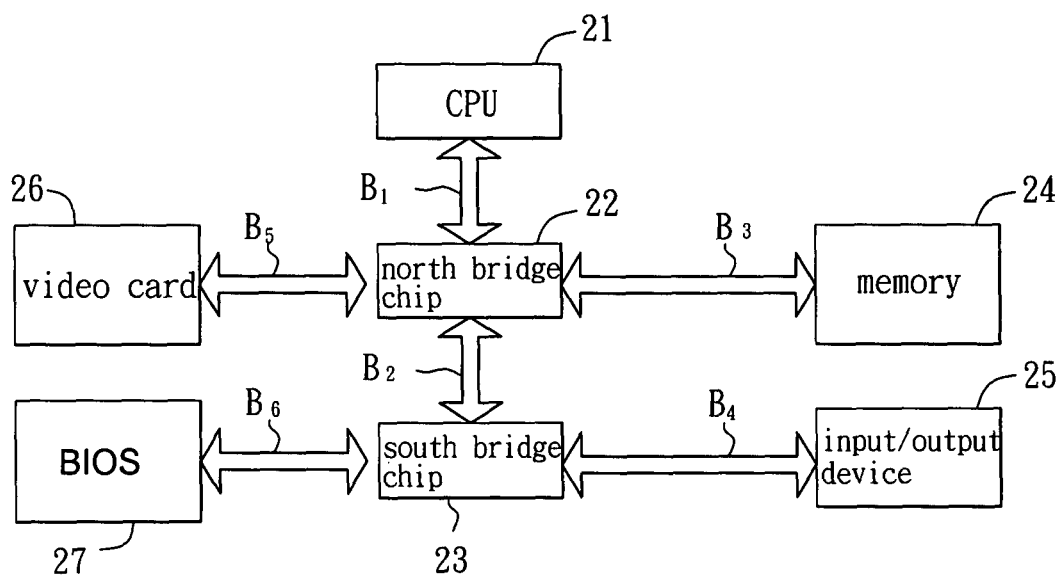
FIG. 2 is a schematic illustration showing a computing device applying a method of setting specific scan codes for a manual input device according to the invention.

Referring to FIG. 2, a computing device 2 includes a central processing unit (CPU) 21, a north bridge chip 22 and a south bridge chip 23. The CPU 21 is connected to the north bridge chip 22 through a front-end bus $B_1$, and the north bridge chip 22 is connected to the south bridge chip 23 through a bus $B_2$. Herein, the north bridge chip 22 is mainly connected to a high-speed peripheral apparatus, such as a memory 24 and a video card 26. The memory 24 is connected to the north bridge chip 22 through a memory bus $B_3$. The video card 26 is connected to the north bridge chip 22 through a video card bus $B_5$, and an output port of the video card 26 may be further connected to a display (not shown) through a display cable so that an image may be displayed. In addition, the south bridge chip 23 is mainly connected to a low-speed peripheral apparatus such as an input/output device 25 through a bus B4, and a basic input/out system (BIOS) is connected to the south bridge 23 by a bus B6. Wherein, the input/output device 25 may be an input device such as a mouse, a keyboard or a scanner, or may be an output device such as a printer. The invention relates to the method of setting specific scan codes for a manual input device.

Figure 3:
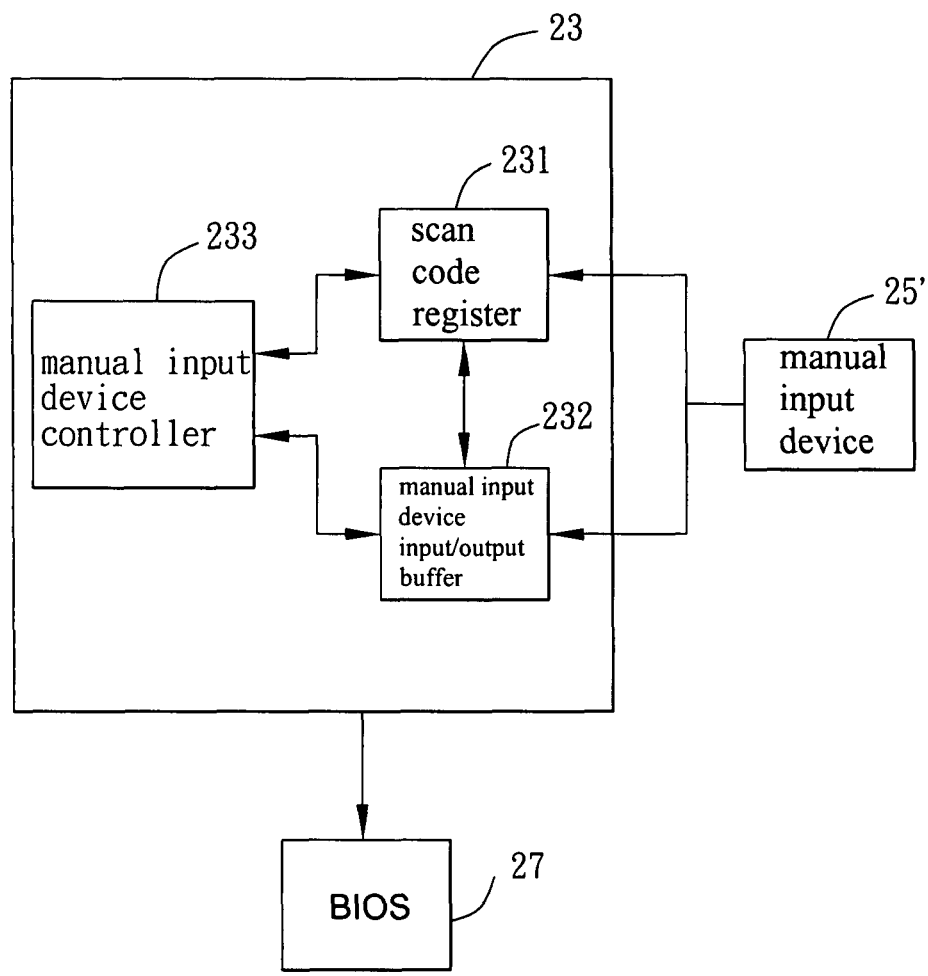
FIG. 3 is a schematic illustration showing a part of the computing device in FIG. 2 applying the method of setting the specific scan codes for the manual input device according to the invention.

FIG. 3 is a schematic illustration showing a part of the computing device 2 in FIG. 2 applying the method of setting the specific scan codes for the manual input device according to the invention. The south bridge chip 23 includes a scan code register 231, a manual input device input/output buffer 232 and a manual input device controller 233, and is used in cooperation with a manual input device 25' and the BIOS 27. In this embodiment, the manual input device 25' may be, without limitation to, a keyboard or a mouse, and is coupled to the computing device 2 through a PS2 interface or a USB interface.

Usually, the user can input the information to the computing device 2 by pressing the manual input device 25'. When the manual input device 25' is being pressed, the manual input device 25' generates a corresponding scan code and transmits the scan code to the manual input device input/output buffer 232. As mentioned above, the manual input device input/output buffer 232 receives all signals generates by the manual input device 25', and then the manual input device controller 233 judges whether the signal generated by the manual input device 25' is the scan code. If the signal is the scan code, the signal is transmitted to the scan code register 231. Finally, the manual input device controller 233 recognizes a customized scan code in the scan code register 231 corresponding to the scan code, and establishes commands to control the computing device 2 or to input data to the computing device 2 according to the meaning represented by the customized scan code.

For example, a specific key, such as "Ctrl+C", corresponding to the customized scan code that is often used by the user represents a copy command, and a specific key, such as "Ctrl+V" represents a paste command, or a specific key "Ctrl+Alt+delete" represents a command for opening the Windows task manager. Thus, the user can simplify the redundant command mode and thus save the time by setting some commands or the scan codes of some specific keys as the customized scan codes.

Figure 4:
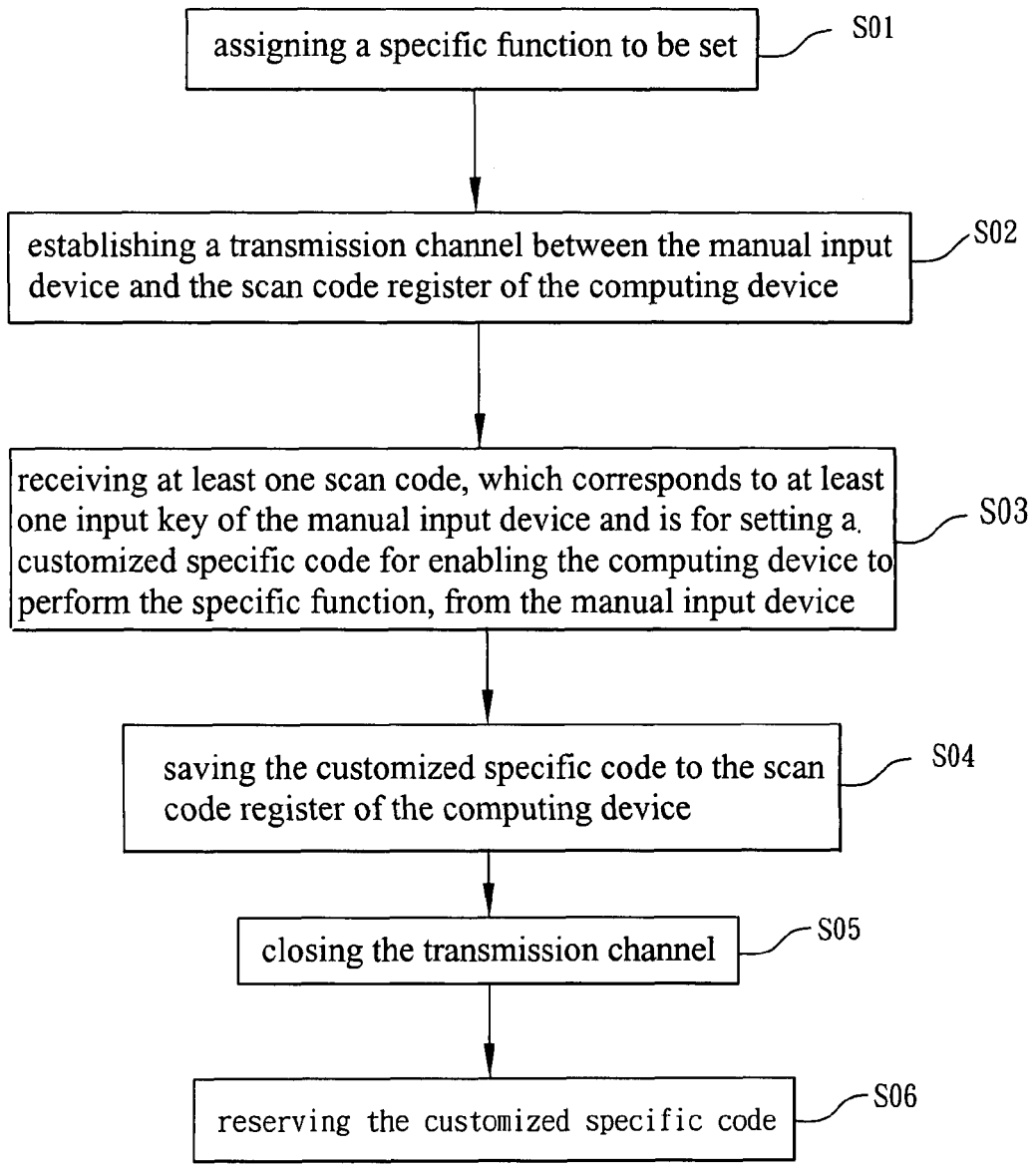
FIG. 4 is a flow chart showing a method of setting specific scan codes for the manual input device according to a preferred embodiment of the invention.

FIG. 4 is a flow chart showing the method of setting specific scan codes for the manual input device 25' according to the invention. Referring to FIG. 4, the method includes the following steps.

In step S01, a specific function to be set is assigned.

In step S02, a transmission channel between the manual input device 25' and the scan code register 231 of the computing device 2 is established.

In step S03, at least one scan code, which corresponds to at least one input key of the manual input device 25' and is for setting a customized specific code for enabling the computing device 2 to perform the specific function, is received from the manual input device 25'.

In step S04, the customized specific code is saved to the scan code register 231 of the computing device 2.

In step S05, the transmission channel is closed.

In step S06, the customized specific code is reserved.

The special function may be a wake-up function, a keyboard booting function, a window browser opening function or a screen switching function. The customized specific code may correspond to the input of the keyboard, to the input of the mouse or even the input combination of the keyboard and the mouse. In addition, the customized specific code may be reserved in the BIOS, the operation system or the scan code register.

In the following, illustrations will be made by taking the specific key for waking up the computing device 2 from the sleep state with the keyboard serving as the manual input device as an example. Firstly, the specific key for waking up the computing device 2 has to be assigned. Next, the manual input device controller 233 establishes a transmission channel between the scan code register 231 and the manual input device (keyboard) 25, and waits for the user to press the key of the manual input device (keyboard) 25 to serve as the specific key for waking up the computing device 2. Then, the manual input device (keyboard) 25 generates an input scan code corresponding to the specific key input by the user, and transmits the input scan code to the scan code register 231 and the manual input device input/output buffer 232.

The manual input device controller 233 sets the input scan code as a customized specific code for enabling the computing device 2 to perform the wake-up function, and saves the customized specific code to the scan code register 231. After that, the manual input device controller 233 closes the transmission channel. The manual input device controller 233 reserves the received customized specific code to perform the subsequent operation. After the setting is finished, the system can compare the scan code of the manual input device (keyboard) 25 with the customized specific code to determine whether they are the same and thus to judge whether the user has pressed the specific key of the manual input device (keyboard) 25.

It is to be specified that the specific key is not particularly restricted to "one single key", and the combination of keys, such as the simultaneous pressing of two keys "Ctrl+W" or the simultaneous pressing of three keys "Ctrl+Alt+R" may serve as the specific key. In another embodiment, the customized specific code can correspond to the combination of the keyboard and the mouse.

The customized specific code may be written to the BIOS 27, and then the customized specific code may be loaded from the BIOS 27 so that the computing device 2 can provide the simple sleep-wake-up function. In general, when the computing device 2 is booting, the south bridge chip 23 can load the customized specific code from the BIOS 27 to the scan code register 231. Thus, after the computer has booted up, the specific key of the manual input device can control the computing device 2 to perform the specific function and this manner can be easily implemented in the lower level or easier computing device.

In addition, the customized specific code may also be saved to an operation system of the computing device 2, such as a storage, including a hard drive or a system memory, allocated by the operation system. After the computing device 2 finishes the booting procedure and can be controlled by the operation system, the operation system loads the customized specific code from the hard drive or the system memory to the scan code register 231, and then the computing device 2 itself may provide the sleep-wake-up function.

In addition, the customized specific code after being completely set can be directly reserved in the scan code register 231 to serve as a scan code corresponding to a specific function. This is different from the BIOS 27 in that the customized scan code reserved in the scan code register 231 disappears with the shutdown of the computing device 2. Thus, when the computing device 2 boots up again, the scan code register 231 cannot reserve the customized specific code set at this time, and the new customized specific code has to be loaded from the BIOS 27. That is, the customized specific code reserved in the scan code register 231 can only serve as the specific key when the computing device 2 is operating at that time.

Figure 5:
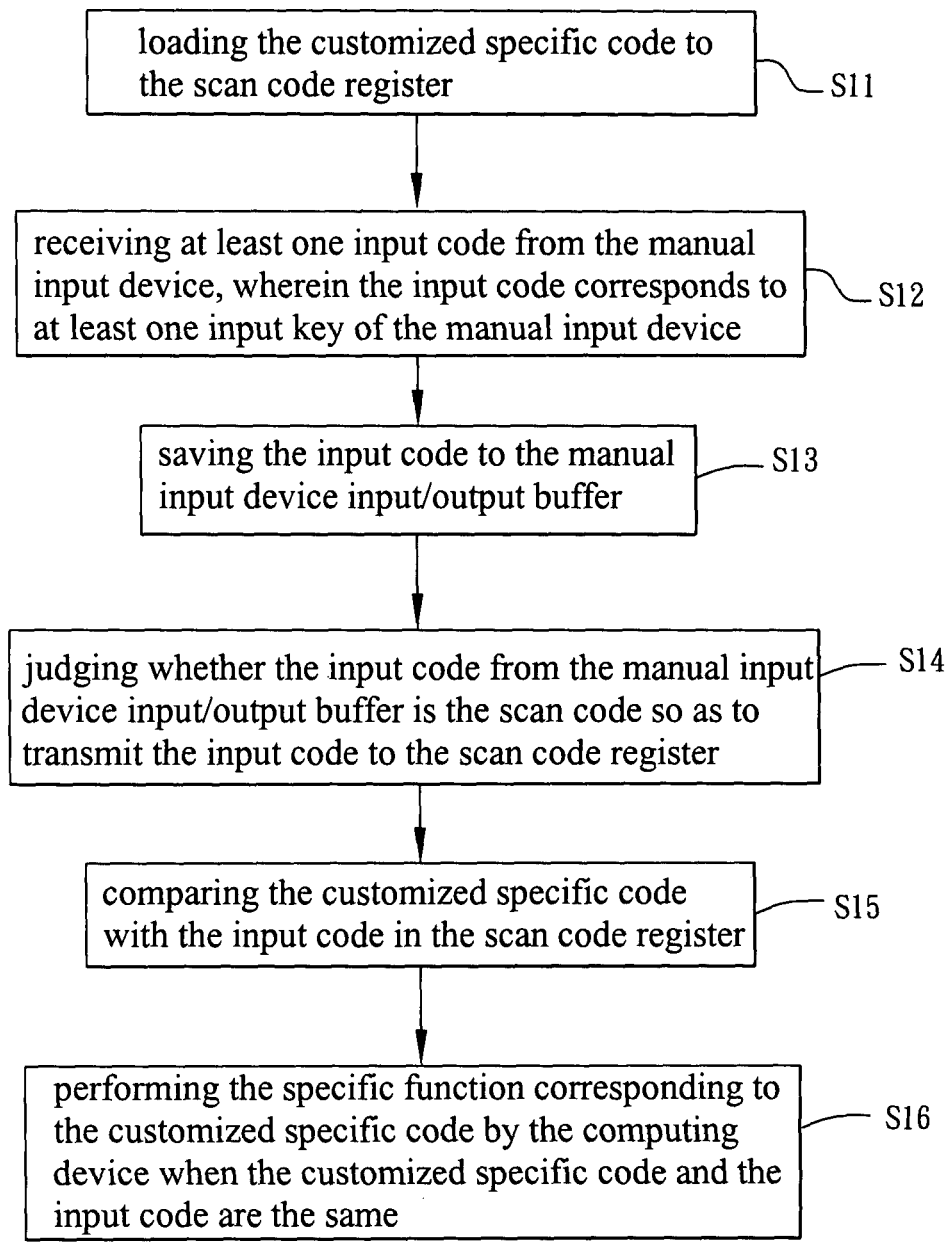
FIG. 5 is a flow chart showing a method of judging whether the input of the manual input device corresponds to the customized specific code according to the preferred embodiment of the invention.

Next, how to judge whether the input of the manual input device 25' corresponds to the customized specific code will be illustrated with reference to FIG. 5. This method includes the following steps S11 to S16.

In step S11, the customized specific code is loaded to the scan code register 231.

In step S12, at least one input code is received from the manual input device 25', wherein the input code corresponds to at least one input key of the manual input device 25'.

In step S13, the input code is saved to the manual input device input/output buffer 232.

Step S14 judges whether the input code from the manual input device input/output buffer 232 is the scan code so as to transmit the input code to the scan code register 231.

In step S15, the customized specific code is compared with the input code in the scan code register 231.

In step S16, when the customized specific code and the input code are the same, the computing device 2 performs the specific function corresponding to the customized specific code.

Illustrations will be made by taking the computing device 2, which is woken up from the sleep state, as an example. For example, if the customized specific code is saved to the BIOS or the operation system, the computing device 2 first loads the customized specific code to the scan code register 231. When the computing device 2 enters the sleep state, the user presses the key of the keyboard to generate an input code. The south bridge chip 23 receives the input code and then saves the input code to the manual input device input/output buffer 232, then judges whether the input code from the manual input device input/output buffer 232 is the scan code and transmits the input code to the scan code register 231, and then compares the customized specific code and the input code in the scan code register 231. When the customized specific code is the same as the input code, the south bridge chip 23 can output an interruption to inform the computing device to perform the wake-up function. Thus, when the user wants to wake up the computing device 2, he or she may press the initially set input key through the manual input device 25' so that the manual input device 25' generates and transmits an input code to the manual input device input/output buffer 232. The manual input device controller 233 judges whether the input code is the scan code. If the input code is the scan code, the input code is transmitted to the scan code register 231.

After that, the manual input device controller 233 compares the customized specific code with the input code to determine whether they are the same. If the input code and the customized specific code are the same, a wake-up signal is transmitted to a power management system of the computing device 2 to reboot the computing device 2 so that the computing device 2 returns to the wake-up state from the sleep state. If the input code is different from the customized specific code, the computing device 2 is still kept in the sleep state.

In addition, if the customized specific code is reserved in the scan code register 231 after the setting is finished and when the computing device 2 enters the sleep state, the user can press the key of the keyboard to wake up the computing device 2. The input code of the keyboard and the customized specific code are processed in a manner the same as that of the embodiment mentioned hereinabove, so detailed descriptions thereof will be omitted.

In summary, the transmission channel is established between the scan code register and the manual input device so that the scan code generated by the manual input device can be directly saved to the scan code register without through the manual input device input/output buffer in the method of setting the specific scan code according to the invention. In addition, at least one scan code corresponding to a specific function may be received from the scan code register through the established transmission channel, and the user can set a group of specific function keys by himself or herself according to different setting methods. In addition, because the inputted scan code can be transmitted to the scan code register without through the manual input device input/output buffer, the operation efficiency of the computing device can be further enhanced.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A method for a computing device for handling an input code from a manual input device, comprising:
   assigning a customized specific code corresponding to a specific function of the computing device in a scan code register, wherein the customized specific code is directly transmitted from the manual input device and saved in the scan code register via a temporarily established transmission channel between the manual input device and the scan code register;
   receiving and saving the input code from the manual input device in a manual input device input/output buffer;
   determining whether the input code saved in the manual input device input/output buffer is a scan code;
   transmitting the scan code from the manual input device input/output buffer to the scan code register if the input code is the scan code;
   comparing the scan code and the customized code; and
   notifying the computing device to perform the specific function if the scan code equals the customized code.

2. The method of claim 1, further comprising:
   loading the customized specific code into the scan code register from a basic input output system (BIOS) prior to said assigning step.

3. The method of claim 1, wherein the manual input device input/output buffer and the scan code register are located in a chip which is not a part of the manual input device.

4. The method of claim 1, wherein the transmission channel is closed after said assigning step.

5. The method of claim 1, further comprising reserving the customized specific code in the operating system.

6. The method of claim 2, further comprising reserving the customized specific code in the BIOS.

7. The method of claim 1, wherein the specific function is waking up the computing device from a sleep state.

8. The method of claim 1, wherein the customized specific code is generated by a combination of keys of the manual input device.

9. The method of claim 1, wherein the manual input device comprising a combination of a keyboard and a mouse.

10. A chip of a computing device for handling an input code from a manual input device, comprising:
   a manual input device input/output buffer for receiving and saving the input code from the manual input device;
   a scan code register for receiving and saving a customized specific code directly via a temporarily established transmission channel between the manual input device and the scan code register, wherein the customized specific code is assigned for a specific function of the computing device; and
   a controller for performing the following steps:
      determining whether the input code saved in the manual input device input/output buffer is a scan code;
      transmitting the scan code from the manual input device input/output buffer to the scan code register if the input code is the scan code;
      comparing the scan code and the customized code; and
      notifying the computing device to perform the specific function if the scan code equals the customized code.

11. The chip of claim 10, wherein the controller further loading the customized specific code into the scan code register from a basic input output system (BIOS) prior to said assigning step.

12. The chip of claim 10, wherein the chip is not a part of the manual input device.

13. The chip of claim 10, wherein the transmission channel is closed after said assigning step.

14. The chip of claim 10, wherein the controller further reserving the customized specific code in the operating system.

15. The chip of claim 10, wherein the controller further reserving the customized specific code in the BIOS.

16. The chip of claim 10, wherein the specific function is waking up the computing device from a sleep state.

17. The chip of claim 10, wherein the customized specific code is generated by a combination of standard keys of the manual input device.

18. The chip of claim 10, wherein the manual input device comprising a combination of a keyboard and a mouse.

19. A computing device, comprising:
   a manual input device; and
   a chip for handling an input code from the manual input device, comprising:
      a manual input device input/output buffer for receiving and saving the input code from the manual input device;
      a scan code register for receiving and saving a customized specific code directly via a temporarily established transmission channel between the manual input device and the scan code register, wherein the customized specific code is assigned for a specific function of the computing device; and
      a controller for performing the following steps:
         determining whether the input code saved in the manual input device input/output buffer is a scan code;
         transmitting the scan code from the manual input device input/output buffer to the scan code register if the input code is the scan code;
         comparing the scan code and the customized code; and
         notifying the computing device to perform the specific function if the scan code equals the customized code.

* * * * *